(12) United States Patent  
Elfadel et al.

(10) Patent No.: US 8,407,632 B2  
(45) Date of Patent: Mar. 26, 2013

(54) DETECTING DOSE AND FOCUS VARIATIONS DURING PHOTOLITHOGRAPHY

(75) Inventors: Ibrahim M. Elfadel, Cortlandt Manor, NY (US); Ying Liu, Austin, TX (US); Stanislav Polonsky, Putnam Valley, NY (US); Amith Singhee, Yonkers, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 12/881,548

(22) Filed: Sep. 14, 2010

(65) Prior Publication Data

US 2012/0065765 A1   Mar. 15, 2012

(51) Int. Cl.  
*G06F 17/50* (2006.01)

(52) U.S. Cl. ............................. 716/54; 716/55; 716/106

(58) Field of Classification Search ..................... 716/54, 716/55, 106  
See application file for complete search history.

(56) References Cited

U.S. PATENT DOCUMENTS

| | | | |
|---|---|---|---|
| 4,585,342 A | 4/1986 | Lin et al. | |
| 4,929,083 A | 5/1990 | Brunner et al. | |
| 6,232,619 B1 * | 5/2001 | Chen et al. | 257/48 |
| 6,429,667 B1 | 8/2002 | Ausschnitt et al. | |
| 6,513,151 B1 | 1/2003 | Erhardt et al. | |
| 6,535,280 B1 | 3/2003 | La Fontaine et al. | |
| 6,842,500 B1 | 1/2005 | Komatsuda et al. | |
| H0002114 H | 2/2005 | Novak et al. | |
| 7,192,790 B2 | 3/2007 | Ishii et al. | |
| 7,342,641 B2 | 3/2008 | Sogard et al. | |
| 7,941,768 B1 * | 5/2011 | Wei | 716/54 |
| 2004/0058256 A1 | 3/2004 | Fujisawa et al. | |
| 2008/0221709 A1 | 9/2008 | Ishii et al. | |
| 2008/0295049 A1 * | 11/2008 | Izuha | 716/5 |
| 2009/0191696 A1 | 7/2009 | Shao et al. | |
| 2009/0242513 A1 * | 10/2009 | Funk et al. | 216/67 |

FOREIGN PATENT DOCUMENTS

JP   2004251803 A   9/2004

* cited by examiner

*Primary Examiner* — Vuthe Siek  
*Assistant Examiner* — Mohammed Alam  
(74) *Attorney, Agent, or Firm* — Garg Law Firm, PLLC; Rakesh Garg; Libby Z. Toub (57) ABSTRACT

A method, system, and computer usable program product for detecting dose and focus variations during photolithography are provided in the illustrative embodiments. A test shape is formed on a wafer, the wafer being used to manufacture integrated circuits, the test shape being formed using a dose value and a focus value that are predetermined for the manufacturing. A capacitance of the test shape is measured. The capacitance is resolved to a second dosing value and a second focus value using an extraction model. A difference between the dosing value and the second dosing value is computed. A recommendation is made for dosing adjustment in the manufacturing based on the difference.

20 Claims, 6 Drawing Sheets

DETECTING DOSE AND FOCUS VARIATIONS DURING PHOTOLITHOGRAPHY

BACKGROUND OF THE INVENTION

1. Field of the Invention

The present invention relates generally to an improved integrated circuit manufacturing system, and in particular, to a method for improving the manufacturing quality of an integrated circuit. Still more particularly, the present invention relates to a method, system, and computer usable program code for detecting dose and focus variations during photolithography.

2. Description of the Related Art

Modern day electronics include components that use integrated circuits (ICs). Integrated circuits are electronic circuits formed using semiconductor substrates and by adding impurities to form solid-state electronic devices, such as transistors, diodes, and resistors. Commonly known as a "chip", an integrated circuit is generally encased in hard plastic. The components in modern day electronics generally appear to be rectangular black plastic pellets with connector pins protruding from the plastic encasement.

Circuit designers use a variety of software tools to design and test electronic circuits that accomplish an intended task. For example, a digital circuit may be designed to accept digital inputs, perform some computation, and produce a digital output. An analog circuit may be designed to accept analog signals, manipulate the analog signals, such as by amplifying, filtering, or mixing the signals, and produce an analog or digital output. Generally, any type of circuit can be designed as an IC.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

SUMMARY OF THE INVENTION

The illustrative embodiments provide a method, system, and computer usable program product for detecting dose and focus variations during photolithography. An embodiment forms a test shape on a wafer, the wafer being used to manufacture integrated circuits, the test shape being formed using a dose value and a focus value that are predetermined for the manufacturing. The embodiment measures a capacitance of the test shape. The embodiment resolves the capacitance to a second dosing value and a second focus value using an extraction model. The embodiment computes a difference between the dosing value and the second dosing value. The embodiment makes a recommendation for dosing adjustment in the manufacturing based on the difference.

BRIEF DESCRIPTION OF THE DRAWINGS

The novel features believed characteristic of the invention are set forth in the appended claims. The invention itself; however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

The invention recognizes that given the ever-reducing size of IC components and the increasing number of components per unit area, masks are becoming increasingly problematic for manufacturing. In order to manufacture shapes on a wafer using a mask, the dosing and focus have to be controlled within specified parameters. Presently, dosing and focus are predetermined for a manufacturing step. The manufacturing process then applies those settings at the appropriate step.

The invention recognizes that this predetermination of dosing and focus often results in undesirable conditions during production manufacturing. For example, the predetermined focus may be correct for an ideal wafer, but not for the actual production conditions. The invention recognizes that the predetermined focus may cause an off-focus exposure for a variety of reasons. For example, a production wafer's non-flatness, thickness of photoresist, the tool-chuck's non-flatness, auto-focus errors, lens aberration, lens heating, or focus drift due to other reasons may cause the actual exposure to be different from the expected exposure using the predetermined focus setting.

Similarly, the invention recognizes that actual dosing conditions may differ from the predetermined dose setting. In other words, a predetermined dosing may cause undesirable dosing, and consequently undesirable electrical characteristics, when used during production photolithography. The invention recognizes that many reasons may contribute to the over or under-dosing resulting from the predetermined dosing. For example, light source imperfections, field-to-field dose errors, or dose non-uniformity in a field due to tool or mask errors may be some reasons why a predetermined dosing may not be correct for production.

Presently, dose and focus variation are addressed by the manufacturer of the equipment used in photolithography. Consequently, the present solutions for dose and focus adjustments are static, have long turn-around times, and address only a limited number of variations experienced in the past.

The invention recognizes that with the advancement of photolithography technology, the depth of focus is decreasingly dramatically and exacerbating the off-focus and offdosing problems. The demands of the industry require more accurate spatial models for focus and dosing variations than are currently available. Furthermore, the invention recognizes that fast focus and dosing measurement during the manufacturing process is desirable to enable in-line control and adjustment of these parameters between or during the production manufacturing steps.

The illustrative embodiments used to describe the invention address and solve these and other problems related to printing shapes of a layout in photolithography. The illustrative embodiments provide a method, computer usable program product, and an apparatus for detecting dose and focus variations during photolithography.

The examples in this disclosure are used only for the clarity of the description and are not limiting on the illustrative embodiments. Additional operations, actions, tasks, activities, and manipulations will be conceivable from this disclosure and the same are contemplated within the scope of the illustrative embodiments.

The illustrative embodiments are described using specific code, data structures, designs, layouts, schematics, and tools only as examples and are not limiting on the illustrative embodiments. The illustrative embodiments may be implemented with respect to other similarly purposed code, data structures, designs, layouts, schematics, and tools within the scope of the invention.

Furthermore, the illustrative embodiments may be described in some instances using particular systems, applications, or architectures only as an example for the clarity of the description. The illustrative embodiments may be used in conjunction with other comparable or similarly purposed systems, applications, or architectures.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 1:
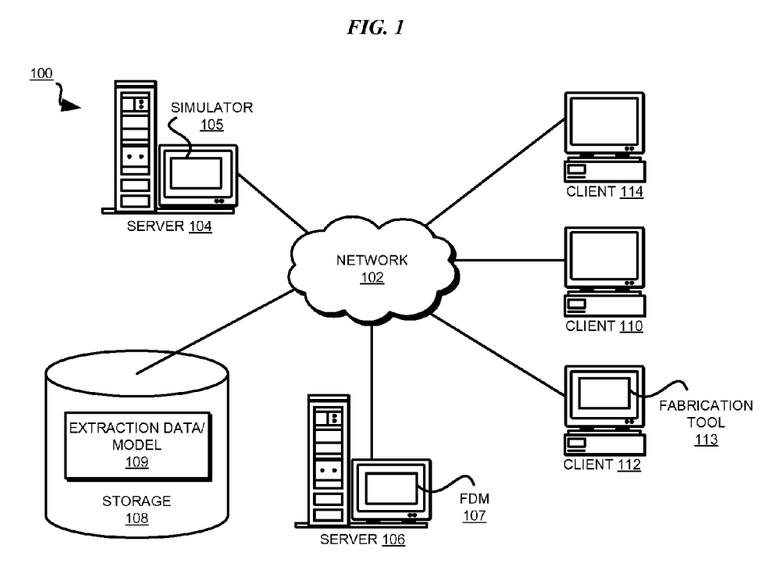
FIG. 1 depicts a pictorial representation of a network of data processing systems in which illustrative embodiments may be implemented.
Figure 2:
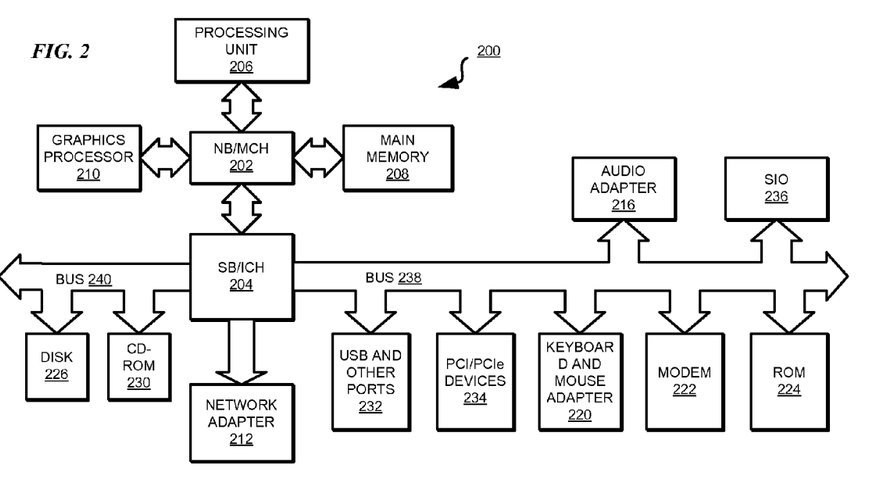
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Server 104 may include simulator 105. Simulator 105 may be an implementation according to an illustrative embodiment. Server 106 may include focus and dosing monitoring tool (FDM) 107. FDM 107 may be an example implementation according to an illustrative embodiment. Storage 108 may include extraction data and/or model 109 according to an illustrative embodiment. Client 112 may include fabrication tool 113. Fabrication tool 113 may be used for performing a manufacturing step in a production environment for manufacturing an integrated circuit on a wafer.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client server environment in which the illustrative embodiments may be implemented. A client server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer in which computer usable program code or instructions implementing the processes may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java is a trademark of Sun Microsystems, Inc., in the United States and other countries).

Instructions for the operating system, the object-oriented programming system, and applications or programs are located on storage devices, such as hard disk drive 226, and may be loaded into main memory 208 for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware and software in FIG. 2 may vary depending on the implementation. Other internal hardware or peripheral devices, such as flash memory, equivalent non-volatile memory, or optical disk drives and the like, or other comparable software or firmware may be used in addition to or in place of the hardware depicted in FIG. 2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIG. 2 and above-described examples are not meant to imply architectural limitations. For example, data processing system 200 also may be a tablet computer, laptop computer, or telephone device in addition to taking the form of a PDA.

Figure 3:
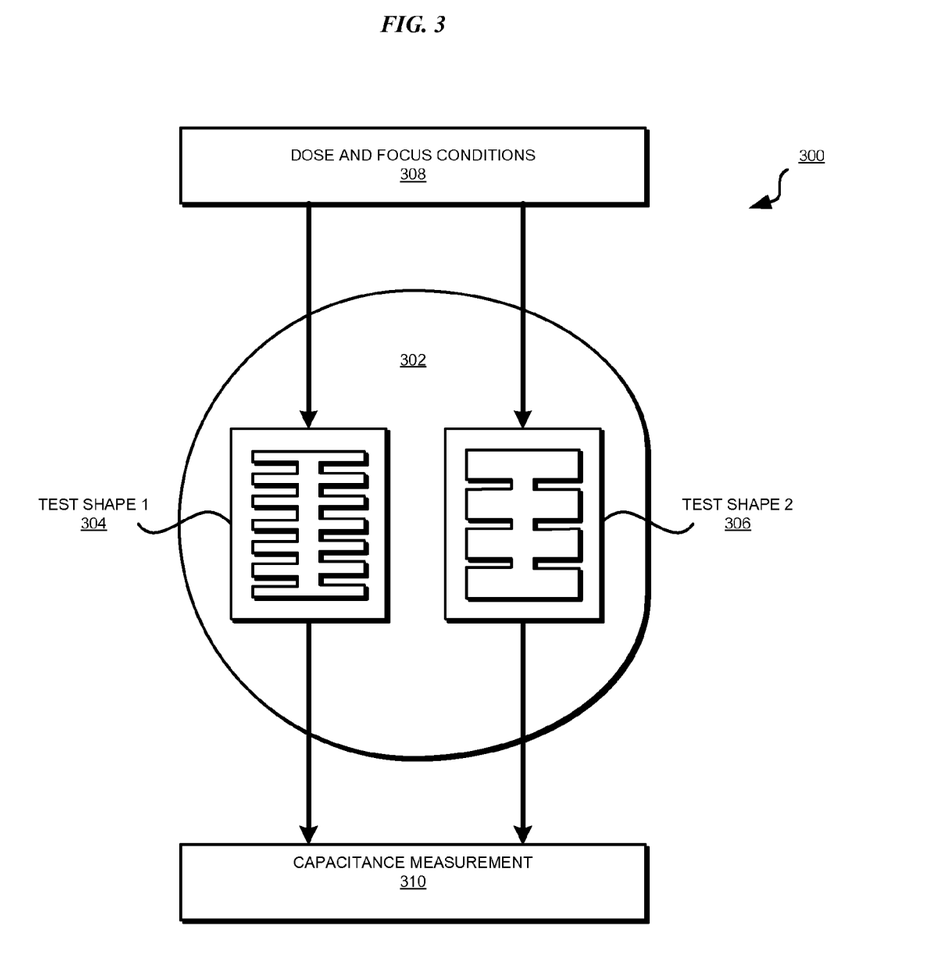
FIG. 3 depicts a block diagram of a configuration for generating extraction data and model for dose and focus variations in accordance with an illustrative embodiment.

With reference to FIG. 3, this figure depicts a block diagram of a configuration for generating extraction data and model for dose and focus variations in accordance with an illustrative embodiment. All or part of configuration 300 can be implemented in simulator 105 in FIG. 1.

For example, in one embodiment, wafer 302 a physical test wafer, and test shapes 304 and 306 may be fabricated onto the physical test wafer. Dosing and focus conditions 308 may be varied, supplied, or otherwise controlled from a simulator, such as simulator 105 in FIG. 1.

As another example, in another embodiment, wafer 302 a simulated test wafer, and test shapes 304 and 306 may be simulated onto the simulated test wafer, such as by using simulator 105 in FIG. 1. Dosing and focus conditions 308 may be varied, supplied, or otherwise controlled using simulator 105 in FIG. 1 as well.

Capacitance measurement 310 of test shapes 304 and 306 may be performed using any existing methods for capacitance measurement in integrated circuit fabrication.

The invention recognizes that different shapes to be printed respond differently to change in focus and/or dosing. The invention recognizes that very sparse or very dense grating in design is more sensitive to these changes than other features. Grating in a design can be envisioned as features that are adjacent and substantially parallel to each other. For example, structures printed as parallel strips or blocks may be representative of the grating in a design. Sparse grating is when narrower than a threshold value structures are separated by a separation greater than a separation threshold. Dense grating is when wider than a threshold value structures are separated by a separation smaller than a separation threshold.

Accordingly, FIG. 3 depicts two example test shapes representative of sparse and dense grating to be used for generating extraction data and model for dose and focus variations. Test shape 304, labeled test shape 1, may represent sparse grating that is expected to be printed in configuration 300. Test shape 306, labeled test shape 2, may represent dense grating that is expected to be printed in configuration 300. Generally, any suitable shape may be used as test shape 306 or 308 within the scope of the invention.

Dosing changes, focus changes, or both, may be controlled and supplied to test shapes 304 and 306 as dosing and focus conditions 308. Capacitance measurement 310 of test shapes 304 and 306 measures the capacitance changes in these test structures in response to changing dosing and focus conditions 308.

In essence, configuration 300 generates, through simulation, a volume of extraction data, such as extraction data/model 109 in FIG. 1. Extraction data is data representative of the related values of dosing, focus, and the measured capacitance during various simulations. In other words, one value of dosing, one value of focus, and the measured capacitance of test structure 304 with those values of dosing and focus may form one instance of extraction data. The volume of extraction data preferably includes several sets of these related values.

The volume of extraction data produced in this manner can be used to create an extraction model. In other words, given several different sets of related dosing, focus, and capacitance values, a three dimensional surface can be visualized that connects several instances of the extraction data. The surface can be represented in any manner in software or hardware, such as by a polynomial equation. The representation of one or more such surfaces, such as a pair of such surfaces, one for a sparse grating and the other for a dense grating, is the extraction model according to an embodiment.

For example, a problem to be solved may be represented in two unknowns—the defocus and the dose. To solve for two unknowns such as these, two separate capacitance measurements may be made—for example, one on the sparse grating and the other on the dense grating, or different measurements on any two test structures. Two surfaces similar to surface 402 in FIG. 4 may be formed for each of these two gratings and each surface may represent one equation relating a capacitance value to the two unknown quantities (e.g., defocus and dose). With two gratings (and the corresponding two surfaces) the resulting two equations can be used to solve for the two unknown quantities.

Similarly, to solve for one unknown, one surface would be sufficient. Thus, a set of surfaces together forms a focus/dose (or defocus/dose) extraction model according to the invention. A set of surfaces includes one or more surfaces. Surface 402 in FIG. 4 may represent a part of a complete model, or a complete model, depending on the problem to be solved.

A three dimensional surface is described only as an example and is not limiting on the invention. For example, an implementation may combine other factors, such as spacing, or timing, in addition to dosing and focus to generate four, five, or n-dimensional surfaces and extraction models in a similar manner within the scope of the invention.

Figure 4:
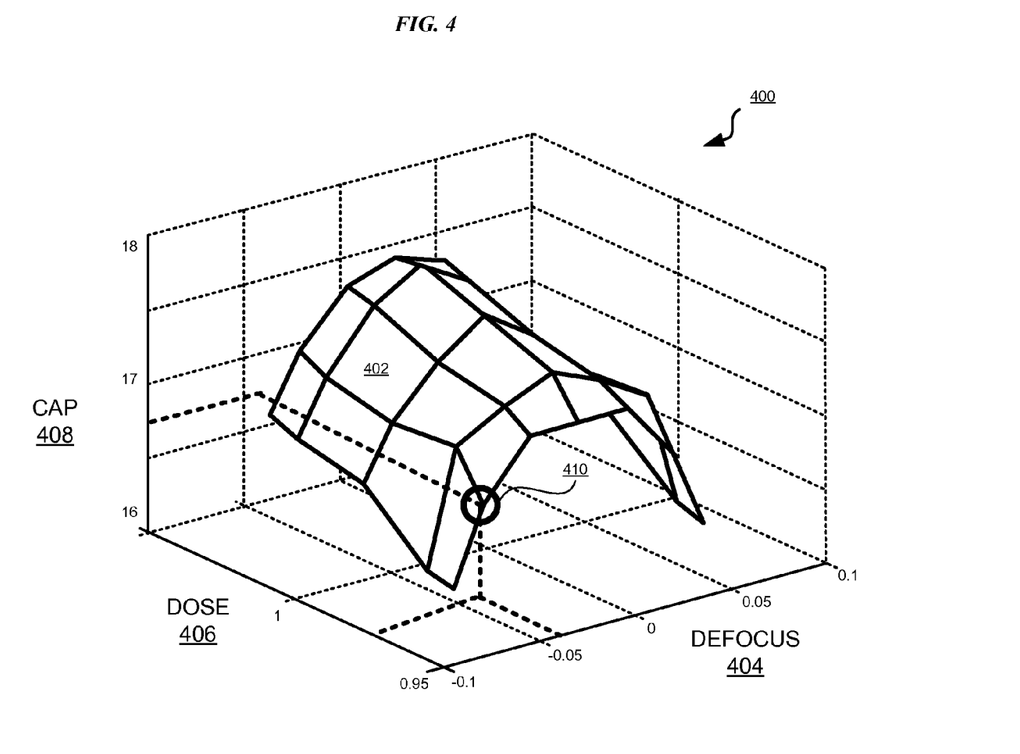
FIG. 4 depicts a plot of one surface of an extraction model in accordance with an illustrative embodiment.

With reference to FIG. 4, this figure depicts a plot of one surface of an extraction model in accordance with an illustrative embodiment. In plot 400, a part of the extraction model 402 is depicted as a graphical representation of extraction data only for the clarity of the description of the embodiment. Extraction model 402 may be represented in equation or code for similar purpose, with or without the graphical representation of FIG. 4, within the scope of the invention.

Model 402 is represented using focus (or defocus) value 404, dose value 406, and capacitance value 408. Any suitable units of measurements may be used for each axis. Point 410 on model 402 represents a specific instance of extraction data. Model 402 may be generated using extraction data generated from simulation, production process, or both. An extraction model, of which model 402 may be a part, may be expressed in the following general form:

$$C_{sparse} = f_s(F,D)$$

$$C_{dense} = f_d(F,D)$$

Where F, D are the defocus and dose values that may be estimated once the capacitances of the two different structures are measured, for example the described sparse and dense grating test structures, $C_{sparse}$ and $C_{dense}$, respectively. The functions $f_s( )$ and $f_d( )$ represent the extraction or de-convolution model.

These functions may be implemented in any suitable way. For example, an implementation may use the functions directly as a lithography simulation, with or without etch simulation, to generate an estimate of the on-wafer geometrical shape of the grating structures. The capacitance between the grating structure and the plate structure (together the test capacitor) can then be extracted using capacitance extraction methods, like numerical field solvers, or other known fast extraction methods.

An implementation may also use these functions as pre-characterized surfaces supported by a finite number of points generated by lithography simulation and capacitance extraction with different defocus and dose values, with or without etch simulation. The surface may then be represented as some mathematical model, for example, Polynomial function of F, D, Neural network, Linear or nonlinear interpolation over the points generated to support to the model, Support vector machines, or any other regression or interpolation method.

During the extraction phase, the dose and defocus values can be computed from any of these model representation in one or more ways. For example, if the model is analytical or otherwise invertible into the following form $$F = g_F(C_{sparse}, C_{dense})$$

$$D = g_D(C_{sparse}, C_{dense})$$

then the defocus (F) and dose (D) values can be directly computed by using this inverted form.

If the model is not invertible, the F and D values can be solved for by iteration. The model is evaluated at a candidate solution (pair of F, D values) for the corresponding capacitance values. A comparison with the measured capacitance values will indicate whether the solution is correct (e.g., the model-predicted capacitance values are close to the measured capacitance values within a specified tolerance), or which alternate candidate solution should be tested next. Any of many preexisting algorithms may be employed for this iterative approach, for example, simulated annealing, Broyden's method, or Linear, quadratic or nonlinear optimization methods.

Figure 5:
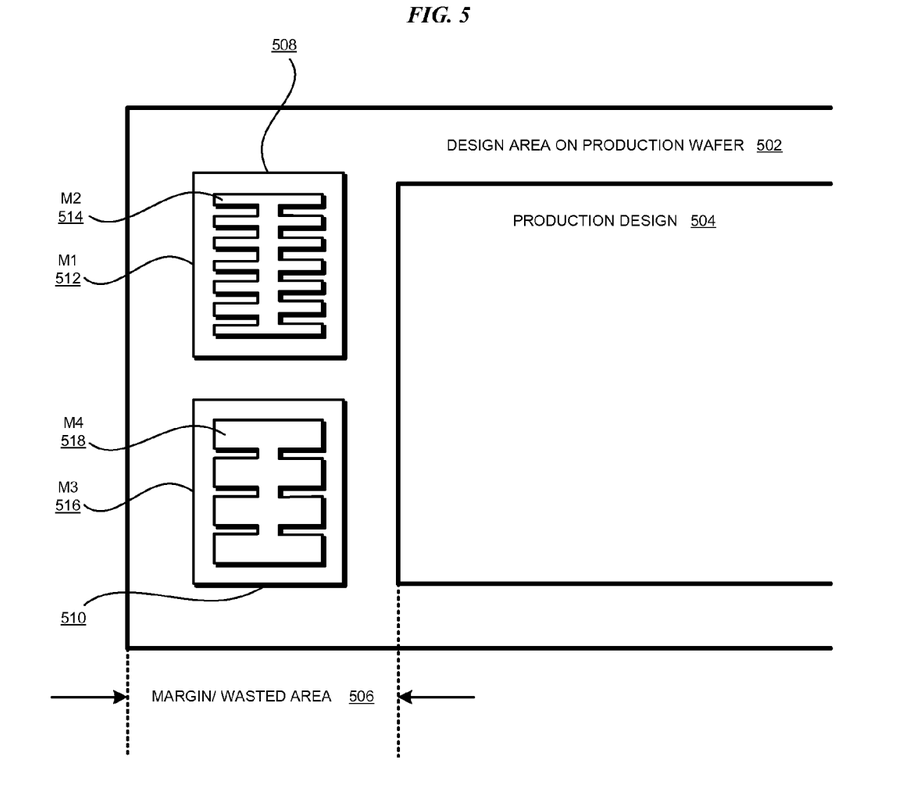
FIG. 5 depicts a block diagram of a configuration for detecting dose and focus variations in a production wafer in accordance with an illustrative embodiment.

With reference to FIG. 5, this figure depicts a block diagram of a configuration for detecting dose and focus variations in a production wafer in accordance with an illustrative embodiment. Design area 502 may be an area of a production wafer reserved or occupied by production design 504 of an integrated circuit being manufactured.

Generally, wasted space 506 is allowed on a production wafer for a variety of reasons, such as to separate two copies of design 504 on the same wafer, or to separate the edge of wafer from design 504. Waste or margin area 506, or another suitable and unused area of the production wafer can be used for fabricating test shapes 508, 510, or both. Any number of test shapes 508 or 510 may be fabricated in this manner within the scope of the invention. The location of test shapes 508 and 510 is depicted only as a suitable example and is not intended to be limiting on the invention. For example, production design 504 may be designed to include 508 and 510 in design area 502 or another location without limitation.

Test shape 508 includes plate 512 labeled M1 and shape 514 labeled M2 of sparse grating. Test shape 510 similarly includes plate 516 labeled M3 and shape 518 labeled M4 of dense grating. Test shapes 508 and 510 are printed using the predetermined dose and focus of the production process step.

A capacitance value is measured in test shape 508. A capacitance value may also be measured in test shape 510. The capacitance is measured between plate 512 and shape 514 in test shape 508, and between plate 516 and shape 518 in test shape 510.

An observed capacitance value is de-convoluted or resolved into the constituent dose and (de)focus values using model 402 in FIG. 4. The resolved dose and focus values are then compared to the predetermined dose and focus values of the production process step. The comparison outputs the delta, or the difference, between the resolved dose and focus using the model and the predetermined dose and focus of the production process.

Measurement of capacitance values, extraction of the capacitance value using the extraction model, and generating the delta dosing and delta focus outputs can be implemented in a dose and focus monitor, such as FDM 107 in FIG. 1. The FDM according to an embodiment may simply report the delta values so that a person or a system may become aware of the discrepancies between the actual and the predetermined dose and focus values.

One embodiment of a FDM may accept a desired value of the capacitance in test structure 508 or 510 as an input. The desired value of capacitance may be de-convoluted using model 402 in FIG. 4 in a similar manner. The FDM may then compute the delta dose and delta focus between the actual measured capacitance and the desired capacitance.

The delta values of the dose and focus can subsequently be incorporated into the production process in-line. For example, the dosing and focus of the production process may be adjusted during production manufacturing, while production steps are being performed, or between production steps, as may be suitable in a given circumstance. A fabrication tool, such as fabrication tool 113 in FIG. 1, may accept the delta values and adjust a previously set value for dosing, focus, or both, accordingly.

Figure 6:
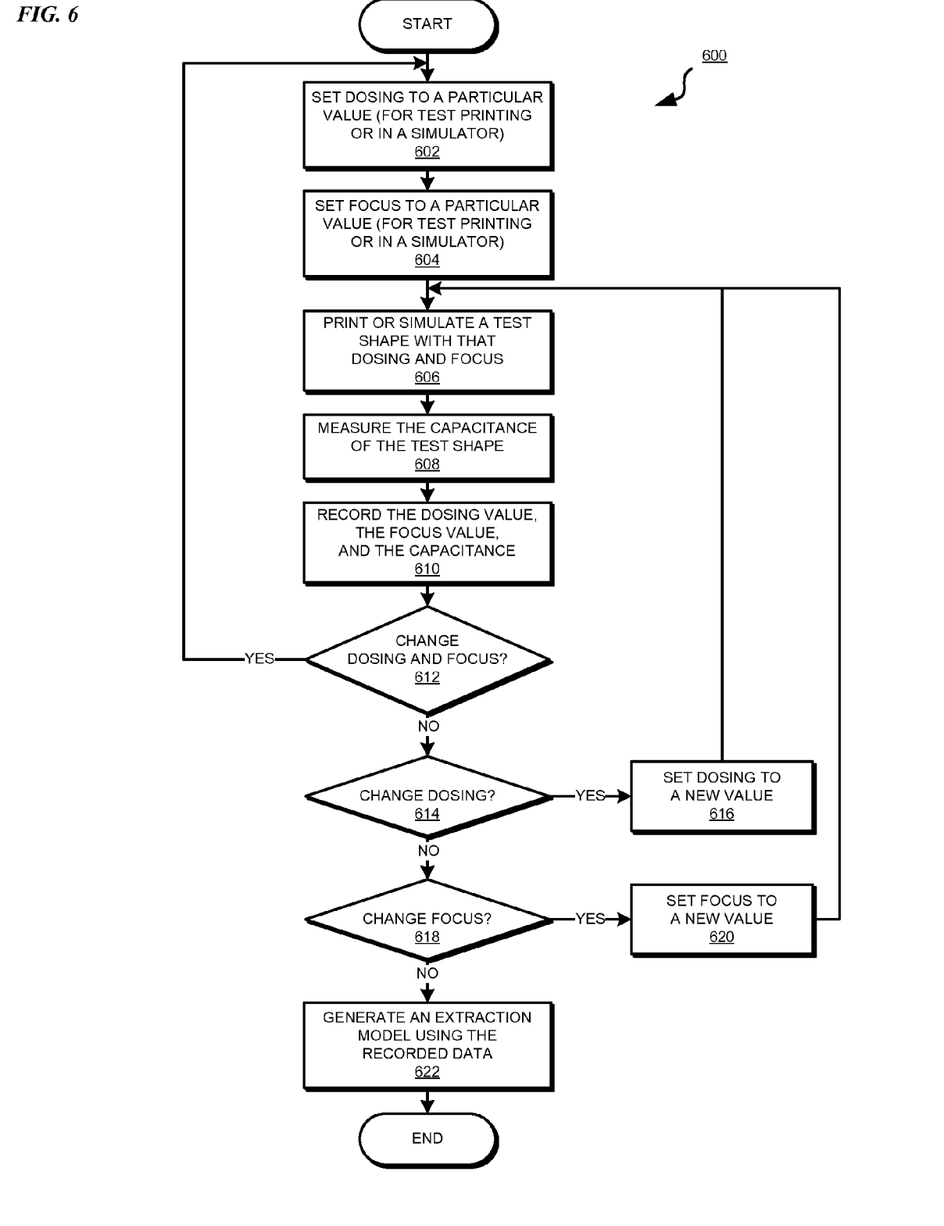
FIG. 6 depicts a flowchart of a simulation process for generating an extraction model in accordance with an illustrative embodiment.

With reference to FIG. 6, this figure depicts a flowchart of a simulation process for generating an extraction model in accordance with an illustrative embodiment. Process 600 may be implemented in a simulator, such as simulator 105 in FIG. 1.

Process 600 begins by setting the dosing to a particular value (step 602). Process 600 sets the focus to a particular suitable value (step 604). The dosing and the focus according to the values set in steps 602 and 604 may be performed on a test printing of an actual test wafer, or in a simulated printing.

Process 600 prints or simulates a test shape using the set values of dosing and focus (step 606). Process 600 measures the capacitance of the test shape (step 608). Process 600 records the dosing value, the focus value, and the measured capacitance value (step 610).

Process 600 determines whether to change the dosing and the focus values for another extraction data point (step 612). If both values have to be changed ("Yes" path of step 612), process 600 returns to step 602.

If both values are not to be changed ("No" path of step 612), process 600 determines whether only the dosing is to be changed (step 614). If the dosing is to be changed ("Yes" path of step 614), process 600 sets the dosing to a new value (step 616) and returns to step 606.

If the dosing value is not to be changed ("No" path of step 614), process 600 determines whether only the focus is to be changed (step 618). If the focus is to be changed ("Yes" path of step 618), process 600 sets the focus to a new value (step 620) and returns to step 606.

If the focus value is not to be changed ("No" path of step 618), sufficient desired extraction data points may have been recorded. Process 600 generates an extraction model from the recorded data (step 622). Process 600 ends thereafter.

Figure 7:
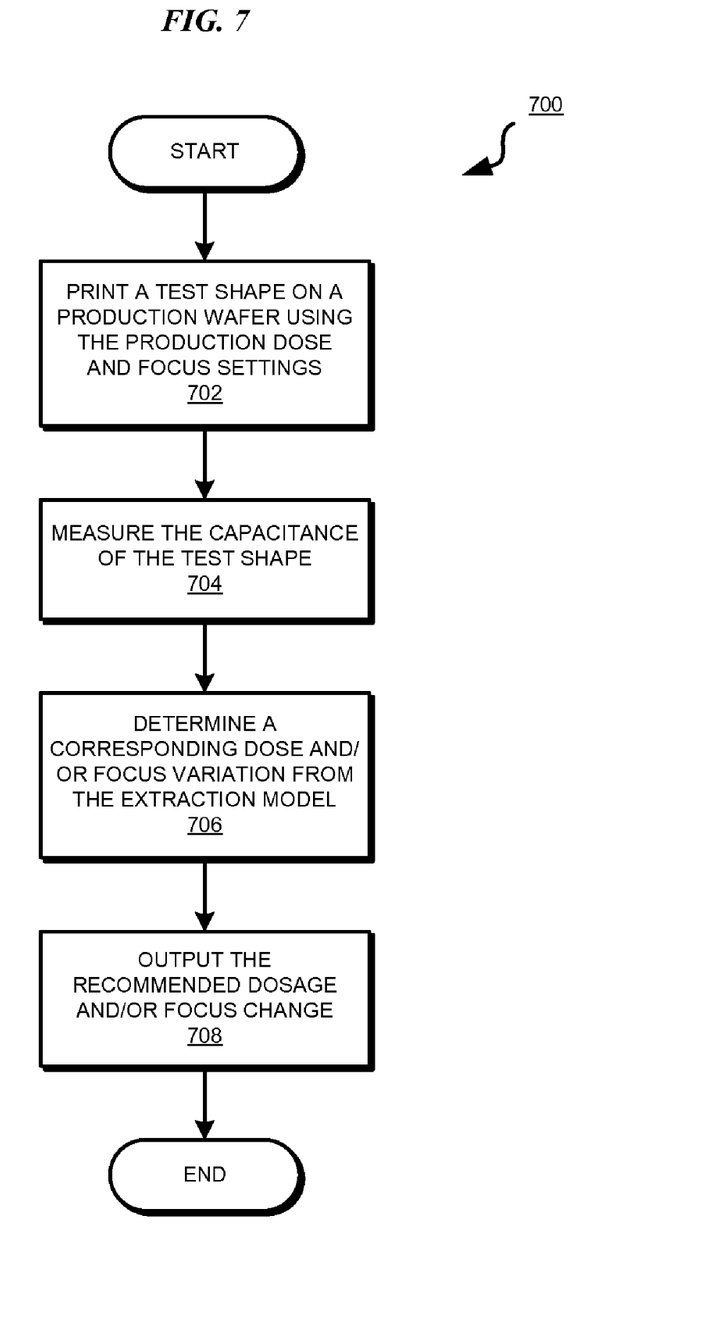
FIG. 7 depicts a flowchart of a process of detecting dosing and/or focus variations in photolithography in accordance with an illustrative embodiment.

With reference to FIG. 7, this figure depicts a flowchart of a process of detecting dosing and/or focus variations in photolithography in accordance with an illustrative embodiment. Process 700 may be implemented in a focus and dosing monitor, such as FDM 107 in FIG. 1.

Process 700 begins by printing a test shape on a production wafer using the predetermined production dose and focus settings (step 702). Process 700 measures the capacitance of the test shape (step 704). Process 700 determines a corresponding dose and focus value from the extraction model and determines the variation or difference between the predetermined dose and focus settings and the dose and focus settings corresponding to the measured capacitance (step 706).

Process 700 outputs the recommended dose and/or focus change as described with respect to FIG. 5 (step 708). Process 700 ends thereafter.

Now, without implying any limitation on the invention or an embodiment thereof as described before, and only as examples, some considerations for implementing an embodiment of the invention are provided below.

Test Capacitor Design

Design a sparse grating to maximize the sensitivity to defocus and dose variations while maintaining manufacturability of the grating. A sparse grating may be defined by two parameters: the width of each grating line (L) and the spacing between the grating lines (S).

Manufacturability of the chosen grating can be tested by ensuring that the on-wafer shapes of the grating predicted by lithography simulation across expected defocus and dose variations have sufficient margin to allow defect-free manufacturing of all parts of the chip, including the grating shape itself. This margin can be tested by simulating other steps of the manufacturing process through expected variations and/or by checking if the simulation-predicted shapes satisfy the design rules determined for the manufacturing process being used.

The most suitable L and S can be chosen by following an iterative optimization procedure. For a candidate L and S solution, the layout of the grating may be generated either manually or automatically. The layout may be subjected to lithography simulation across the expected range of defocus and dose values, and the thickness or area of the process variation band (pvband) of the simulated shapes can be measured. The pvband may be defined as follows—A lithography simulation at any given defocus and dose value predicts the printed shape of the drawn shape. This printed shape is called a contour. For the range of focus and dose values, many different contours may be obtained. The inner contour is the one with the smallest enclosed area and the outer contour is the one with the largest enclosed area. The pvband is the region enclosed by the outer contour that is not enclosed by the inner contour. A next candidate L and S pair may be chosen to increase the measure pvband width or area. The best L and S combination may be the one that gives the largest pvband width/area while maintaining manufacturability.

Design a dense grating to maximize the sensitivity to defocus and dose variations while maintaining manufacturability of the grating. A procedure similar to the one for the sparse grating may be followed to choose the L and S for the dense grating.

The sensitivity of the sparse grating to defocus is generally opposite to that of the dense grating. For increased defocus, the sparse grating may generally print with thinner than designed lines, while the dense grating may generally print with thicker than designed lines.

The test structures may then be designed. A test structure may include one or more grating blocks. A grating block may include a finite number of grating lines connected electrically by one or more wires on the same layer. If there are multiple grating blocks in a grating structure, some cases may require that they must all be either sparse or dense, and they must be connected electrically by one or more wires on the same layer. The size of the grating blocks and the distances between them may be chosen to meet manufacturing constraints, such as minimum and maximum metal density constraints. These manufacturing constraints will depend on the manufacturing process being used.

The test capacitors may then be designed. As an example, a test capacitor may be defined by a test structure on one layer, a plate structure on the upper or lower layer and the inter-layer dielectric and liners between them. A plate structure includes one or more plates connected electrically by wires on the same layer as the plate(s). Each plate may be placed directly above or below a grating block and may be larger in dimension by some margin on all sides. This margin may be determined so that with any expected overlay error between the plate layer and the grating layer, the plate completely covers the grating block. A plate and grating-block together form an example capacitor structure, which is referred to as a sub-capacitor. The size and spacing of the plates may be determined to meet manufacturing constraints, such as minimum and maximum metal density constraints. These manufacturing constraints will depend on the manufacturing process being used.

The manufacturing constraints on the plate layer may influence the design of the test structure and vice versa. For example, a requirement may be imposed that each grating group must be completely covered by one plate. To meet maximum density limits and layer- and orientation-specific spacing constraints, the plates may also be filled with spaces without reducing the metal density much lower than the maximum limit.

The dense grating blocks may need special design if the metal density within a grating block is higher than a set limit. At higher than the set limit for metal densities, the capacitance between a grating block and the plate above/below it can become decreasingly sensitive to variations in the dimensions of the grating lines. A typical density threshold for this may be, for example, forty percent.

To maintain a high sensitivity, every n-th grating line may be electrically connected to form the sub-capacitor with the corresponding plate. Here 'n' can take a value such as 2, 3, 4, etc. The remaining grating lines may be connected together with separate wires to create a secondary grating structure. This secondary grating structure can be connected to ground to remove its influence on the test capacitor.

Alternatively, if the metal density of the secondary grating blocks is much higher than the set limit such that the capacitance between them and the plate structure is practically insensitive to dimension variations in the secondary grating lines, this capacitance (called 'secondary capacitance') can be used as a reference capacitance to remove noise from long range variations like inter-layer dielectric thickness variations. Later paragraphs describe an example use of reference capacitance.

Reference Structures

The use of reference structures to compensate for long range variations other than defocus and dose.

Variations such as inter-layer dielectric thickness variation can also alter the capacitance of the test structures and introduce notable error in the extracted values of defocus and dose if they are larger than a threshold and are not correctly compensated for. These variations are referred to as long range noisy variation (LRNV). A reference capacitor that has a capacitance value largely insensitive to variations in focus and dose, but is sensitive to these other variations, may be used to measure the amount of LRNV in close vicinity of the test structures. Then the contribution of the LRNV on the test structure capacitance can be separated out from the contribution of defocus and dose on the same. For this, the extraction model may be represented in terms of focus (F), dose (D) and the LRNV parameter (p) as the following example:

$$C_{sparse} = f_s(F,D,p)$$

$$C_{dense} = f_d(F,D,p)$$

If the model is invertible, the model may be expressed as $$F = g_f(C_{sparse}, C_{dense}, p)$$

$$D = g_d(C_{sparse}, C_{dense}, p)$$

Now, given the value of p, values of F, D may be obtained in a manner similar to as described earlier.

The value of p may be obtained from a reference structure as follows. The reference capacitor may be defined by two plate structures, one on the same layer as the test structure and the other on the same layer as the plate structure of the test capacitor. Each plate structure may be designed to minimize the sensitivity of the reference capacitance to changes in the planar dimensions of the plate structures. Each plate structure has high metal density, so that the capacitance is largely insensitive to changes in planar dimensions. One possibility of such a reference capacitor is the secondary capacitance defined above. Another possibility is where both plate structures simply include one or more plates connected electrically, with any holes in the plates to meet maximum metal density constraints and layer- and orientation-specific spacing constraints.

One or more reference capacitor may be placed as close as possible to the test capacitors, while meeting manufacturability constraints. A model for the reference capacitance may be generated in a manner similar to the case of the test capacitances and can be represented in general as a function of only the LRNV parameter p since it is nearly insensitive to the focus and dose variations:

$$C_{ref} = f_r(p).$$

The measured reference capacitance may then be used to solve for the value of p from this model in a manner similar to the method for extracting the defocus and dose value from the test capacitor models.

Some weighted combination of the 'p' values extracted from the reference capacitors may then be used in the test capacitor models while extracting the values of focus and dose. If only one reference capacitor is used, this weighted combination may simply be the single extracted 'p' value.

Measurement

The capacitance measurement can be performed using one or more of several known methods. One approach may be to use a tester capable of making capacitance measurements directly. Another approach may be to use integrated capacitance measurement where an on-chip circuit that can measure the capacitance may be used. Some examples of such methods are the Quadrature-clocked Voltage-dependent Capacitance Measurement (QVCM) method and the charge-based or crosstalk-based capacitance measurement (CBCM) methods.

The components in the block diagrams, the equations, and the steps in the flowcharts described above are described only as examples. The components, the equations, and the steps have been selected for the clarity of the description and are not limiting on the illustrative embodiments of the invention. For example, a particular implementation may combine, omit, further subdivide, modify, augment, reduce, or implement alternatively, any of the components or steps without departing from the scope of the illustrative embodiments. Furthermore, the steps of the processes described above may be performed in a different order within the scope of the invention.

Another alternative manner of performing focus and dose measurements and adjustment according to an embodiment is as follows. Focus and dose values may be resolved from multiple instances of the one of more test shapes across the wafer and/or one or more lots of wafers, to compute a range or distribution of the focus and a range or distribution of the dose values that can be expected in the production line. A separate set of ranges or distributions can be computed for each lithography layer (e.g., polysilicon, metal1, metal2, etc.). These ranges or distributions can then together define the required process window that must be satisfied by the circuit layout to ensure acceptable lithographic yield. Lithography simulations can be performed on the layout across these ranges or distributions of focus and dose to check for acceptable printing of the design shapes.

Thus, a computer implemented method, apparatus, and computer program product are provided in the illustrative embodiments for detecting dose and focus variations in photolithography. By using one or more illustrative embodiments of the invention, a production photolithography process can detect dose and focus variations and adjust those values for maintaining desired shapes and electrical characteristics in the production integrated circuit. The process can detect and adjust the dose and focus variations during the manufacturing process, without having to a priori anticipate the variations and compensate (incorrectly) for the actual conditions that may be different from anticipated.

An embodiment may use any suitable algorithm for performing the computations described in this disclosure. An embodiment may also use a combination of two or more different algorithms to perform the same computation. The values, such as the extraction data points, may be saved in any suitable data structure in any suitable data storage device within the scope of the invention.

The invention can take the form of an entirely software embodiment, or an embodiment containing both hardware and software elements. In a preferred embodiment, the invention is implemented in software or program code, which includes but is not limited to firmware, resident software, and microcode.

Furthermore, the invention can take the form of a computer program product accessible from a computer-usable or computer-readable medium providing program code for use by or in connection with a computer or any instruction execution system. For the purposes of this description, a computer-usable or computer-readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W) and DVD.

Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code. A client data processing system may download that computer usable code, such as for storing on a data storage medium associated with the client data processing system, or for using in the client data processing system. The server data processing system may similarly upload computer usable code from the client data processing system. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

What is claimed is:

1. A computer implemented method for detecting dose and focus variations in photolithography, comprising:
   forming a test shape on a wafer, the wafer being used to manufacture integrated circuits, the test shape being formed using a dose value and a focus value that are predetermined for the manufacturing;
   measuring a capacitance of the test shape;
   resolving the capacitance to a second dosing value and a second focus value using an extraction model;
   computing, using a processor and a memory, a difference between the dosing value and the second dosing value; and
   making a recommendation for dosing adjustment in the manufacturing based on the difference.

2. The computer implemented method of claim 1, further comprising:
   computing a second difference between the focus value and the second focus value; and
   making a recommendation for focus adjustment in the manufacturing based on the second difference.

3. The computer implemented method of claim 2, further comprising:
   receiving a desired capacitance value for the test shape;
   resolving the desired capacitance value to a third dose value and a third focus value, wherein the computing the difference is computing the difference between the second focus value and the third focus value.

4. The computer implemented method of claim 1, further comprising:
   receiving a desired capacitance value for the test shape;
   resolving the desired capacitance value to a third dose value and a third focus value, wherein the computing the difference is computing the difference between the second dose value and the third dose value.

5. The computer implemented method of claim 1, further comprising:
   creating a simulation test shape in a simulation environment;
   setting a simulation dose value for the test shape;

setting a simulation focus value of the test shape;
measuring a simulation capacitance of the test shape;
generating an instance of extraction data using the simulation dose value, the simulation focus value, and the simulation capacitance;
repeating the setting the simulation dose value, the setting the simulation focus value, the measuring the simulation capacitance, and the generating to generate a plurality of instances of extraction data; and
creating the extraction model using the plurality of instances.

6. The computer implemented method of claim 5, wherein the simulation test shape is at least two test shapes—a first test shape representing sparse grating, and a second test shape representing dense grating, and wherein the setting the simulation dose value, the setting the simulation focus value, the measuring the simulation capacitance, and the generating the instance of extraction data are performed for both test shapes.

7. The computer implemented method of claim 5, wherein the simulation environment prints the test shape onto a test wafer, wherein the setting the simulation dose value adjusts a dosing on the test wafer, and wherein the setting the simulation focus value adjusts a focus on the test wafer.

8. The computer implemented method of claim 1, wherein the test shape includes a plate shape and a second shape, and wherein the capacitance is measured between the plate shape and the second shape.

9. A computer usable program product comprising a computer usable storage device including computer usable code for detecting dose and focus variations in photolithography, the computer usable code comprising:
computer usable code for forming a test shape on a wafer, the wafer being used to manufacture integrated circuits, the test shape being formed using a dose value and a focus value that are predetermined for the manufacturing;
computer usable code for measuring a capacitance of the test shape;
computer usable code for resolving the capacitance to a second dosing value and a second focus value using an extraction model;
computer usable code for computing a difference between the dosing value and the second dosing value; and
computer usable code for making a recommendation for dosing adjustment in the manufacturing based on the difference.

10. The computer usable program product of claim 9, further comprising:
computer usable code for computing a second difference between the focus value and the second focus value; and
computer usable code for making a recommendation for focus adjustment in the manufacturing based on the second difference.

11. The computer usable program product of claim 10, further comprising:
computer usable code for receiving a desired capacitance value for the test shape;
computer usable code for resolving the desired capacitance value to a third dose value and a third focus value, wherein the computing the difference is computing the difference between the second focus value and the third focus value.

12. The computer usable program product of claim 9, further comprising:
computer usable code for receiving a desired capacitance value for the test shape;
computer usable code for resolving the desired capacitance value to a third dose value and a third focus value, wherein the computing the difference is computing the difference between the second dose value and the third dose value.

13. The computer usable program product of claim 9, further comprising:
computer usable code for creating a simulation test shape in a simulation environment;
computer usable code for setting a simulation dose value for the test shape;
computer usable code for setting a simulation focus value of the test shape;
computer usable code for measuring a simulation capacitance of the test shape;
computer usable code for generating an instance of extraction data using the simulation dose value, the simulation focus value, and the simulation capacitance;
computer usable code for repeating the setting the simulation dose value, the setting the simulation focus value, the measuring the simulation capacitance, and the generating to generate a plurality of instances of extraction data; and
computer usable code for creating the extraction model using the plurality of instances.

14. The computer usable program product of claim 13, wherein the simulation test shape is at least two test shapes—a first test shape representing sparse grating, and a second test shape representing dense grating, and wherein the setting the simulation dose value, the setting the simulation focus value, the measuring the simulation capacitance, and the generating the instance of extraction data are performed for both test shapes.

15. The computer usable program product of claim 13, wherein the simulation environment prints the test shape onto a test wafer, wherein the setting the simulation dose value adjusts a dosing on the test wafer, and wherein the setting the simulation focus value adjusts a focus on the test wafer.

16. The computer usable program product of claim 9, wherein the test shape includes a plate shape and a second shape, and wherein the capacitance is measured between the plate shape and the second shape.

17. The computer usable program product of claim 9, wherein the computer usable code is stored in a computer readable storage medium in a data processing system, and wherein the computer usable code is transferred over a network from a remote data processing system.

18. The computer usable program product of claim 9, wherein the computer usable code is stored in a computer readable storage medium in a server data processing system, and wherein the computer usable code is downloaded over a network to a remote data processing system for use in a computer readable storage medium associated with the remote data processing system.

19. A data processing system for detecting dose and focus variations in photolithography, the data processing system comprising:
a storage device including a storage medium, wherein the storage device stores computer usable program code; and
a processor, wherein the processor executes the computer usable program code, and wherein the computer usable program code comprises:
computer usable code for forming a test shape on a wafer, the wafer being used to manufacture integrated circuits, the test shape being formed using a dose value and a focus value that are predetermined for the manufacturing;

computer usable code for measuring a capacitance of the test shape;

computer usable code for resolving the capacitance to a second dosing value and a second focus value using an extraction model;

computer usable code for computing a difference between the dosing value and the second dosing value; and computer usable code for making a recommendation for dosing adjustment in the manufacturing based on the difference.

20. The data processing system of claim 19, further comprising:

computer usable code for computing a second difference between the focus value and the second focus value; and computer usable code for making a recommendation for focus adjustment in the manufacturing based on the second difference.

* * * * *